(12) United States Patent
Cheng et al.

(10) Patent No.: US 11,462,630 B2
(45) Date of Patent: Oct. 4, 2022

(54) CONFORMAL HALOGEN DOPING IN 3D STRUCTURES USING CONFORMAL DOPANT FILM DEPOSITION

(71) Applicant: Applied Materials, Inc., Santa Clara, CA (US)

(72) Inventors: Rui Cheng, Santa Clara, CA (US); Yi Yang, San Jose, CA (US); Karthik Janakiraman, San Jose, CA (US); Abhijit Basu Mallick, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/640,580

(22) PCT Filed: Aug. 28, 2018

(86) PCT No.: PCT/US2018/048341
§ 371 (c)(1),
(2) Date: Feb. 20, 2020

(87) PCT Pub. No.: WO2019/046301
PCT Pub. Date: Mar. 7, 2019

(65) Prior Publication Data
US 2020/0194571 A1 Jun. 18, 2020

Related U.S. Application Data

(60) Provisional application No. 62/553,902, filed on Sep. 3, 2017.

(51) Int. Cl.
*H01L 29/66* (2006.01)
*H01L 21/02* (2006.01)
*H01L 29/78* (2006.01)

(52) U.S. Cl.
CPC .. *H01L 29/66795* (2013.01); *H01L 21/02208* (2013.01); *H01L 29/785* (2013.01)

(58) Field of Classification Search
CPC ........... H01L 29/66795; H01L 21/0228; H01L 29/785; H01L 29/66545; H01L 21/0217
See application file for complete search history.

(56) References Cited

U.S. PATENT DOCUMENTS 8,114,761 B2    2/2012   Mandrekar et al.
8,580,664 B2   11/2013   Clark
(Continued)

FOREIGN PATENT DOCUMENTS

JP        H03163821 A      7/1991
KR    20020027775 A      4/2002
(Continued)

OTHER PUBLICATIONS

PCT International Search Report and Written Opinion in PCT/US2018/048341 dated Dec. 13, 2018, 11 pages.

*Primary Examiner* — Tony Tran
(74) *Attorney, Agent, or Firm* — Servilla Whitney LLC

(57) ABSTRACT

Embodiments described herein generally relate to doping of three dimensional (3D) structures on a substrate. In some embodiments, a conformal dopant containing film may be deposited over the 3D structures. Suitable dopants that may be incorporated in the film include halogen atoms. The film may be subsequently annealed to diffuse the dopants into the 3D structures.

11 Claims, 1 Drawing Sheet

(56) References Cited

U.S. PATENT DOCUMENTS

| | | | |
|---|---|---|---|
| 9,640,400 | B1 | 5/2017 | Cheng et al. |
| 2008/0132047 | A1 | 6/2008 | Dunne et al. |
| 2012/0252155 | A1 | 10/2012 | Choi et al. |
| 2012/0252197 | A1 | 10/2012 | Clark |
| 2013/0052801 | A1 | 2/2013 | Berliner et al. |
| 2014/0004689 | A1 | 1/2014 | Nainani et al. |
| 2014/0183666 | A1* | 7/2014 | Pramanik ............. H01L 29/401 257/412 |
| 2015/0079733 | A1 | 3/2015 | Oganesian et al. |
| 2015/0087140 | A1 | 3/2015 | Nozawa et al. |
| 2015/0104955 | A1 | 4/2015 | Pore |
| 2016/0056270 | A1 | 2/2016 | Van Dal |
| 2016/0111531 | A1 | 4/2016 | Dong |
| 2017/0170027 | A1* | 6/2017 | Hou .................... H01L 21/3215 |

FOREIGN PATENT DOCUMENTS

| | | |
|---|---|---|
| KR | 101632474 B1 | 6/2016 |
| KR | 20170061724 A | 6/2017 |
| WO | 2014120392 A1 | 8/2014 |

\* cited by examiner

CONFORMAL HALOGEN DOPING IN 3D STRUCTURES USING CONFORMAL DOPANT FILM DEPOSITION

CROSS-REFERENCE TO RELATED APPLICATIONS

This application is the National Stage entry of PCT/US2018/048341, filed on Aug. 28, 2018, which claims priority to U.S. Provisional Application. Ser. No. 62/553,902, filed Sep. 3, 2017, the entire disclosures of which are hereby incorporated by reference herein.

FIELD

Embodiments described herein generally relate to doping of three dimensional (3D) structures formed on a substrate. More specifically, embodiments described herein relate to conformal doping in 3D silicon structures using conformal dopant deposition processes.

BACKGROUND

Three dimensional (3D) transistors, such as fin field-effect transistors (FinFETs) are promising candidates to extend complimentary metal-oxide semiconductor (CMOS) scaling. Such FinFET transistors generally provide for improved electrostatic control (i.e., short channel effects) and lower sensitivity to random dopant fluctuations. However, implementation challenges and process complexity issues exist in the integration of FinFETs at advanced technology dimensions.

For example, one challenge of FinFET integration is dopant concentration in 3D silicon containing device structures. As a result of the lack of a body or back gate bias in fully depleted (i.e., no mobile carriers) FinFET device structures, complicated work function engineering is often necessary to achieve workable threshold voltages for undoped FinFETs. In addition to threshold voltage complications, dopant concentration and dopant distribution within the FinFET structures present additional challenges in 3D device structure manufacturing processes.

3D FETs have been introduced to improve gate control by increasing gate-channel coupling. So that off-state current and short-channel effect can be reduced. One challenge is to form uniform doping in 3D structure. However, other than Si channel, high-K dielectrics may suffer from high densities of interfacial and bulk defects, which could increase carrier scattering, degrade mobility, and reduce drain current.

Fluorine doping can reduce defect densities in high k dielectrics by effectively passivate interfacial dangling bonds and bulk oxygen vacancies. Those may reduce oxide leakage current, improve stability of threshold voltage, and improve device performance. However, previous attempts to dope fluorine by ion implantation have shown that damage to the FinFET fins occur and the process may be ineffective to introduce fluorine uniformly across the entire three-dimensional geometry of the FinFET fins. Therefore, there is a need in the art for improved FinFET doping methods.

SUMMARY

One or more embodiments of the disclosure are directed to methods comprising exposing a substrate to a mixture of a silicon precursor and a halogen precursor to form an amorphous silicon film doped with halogen atoms. The amorphous silicon film doped with halogen atoms is annealed to drive the halogen atoms into the substrate.

Additional embodiments of the disclosure are directed to substrate processing methods comprising depositing a conformal halogen doped silicon film on a three dimensional structure formed on a substrate. The three dimensional structure is a FinFET device. The conformal halogen doped silicon film is annealed to diffuse the halogen into the three dimensional structure to dope the FinFET device with halogen atoms.

Further embodiments of the disclosure are directed to substrate processing methods comprising forming a three dimensional structure on a substrate. The three dimensional structure is exposed to one or more silicon and halogen containing precursors to deposit a conformal amorphous silicon film doped with fluorine atoms. The conformal amorphous silicon film is annealed to diffuse the fluorine atoms from the conformal film into the three dimensional structure. The conformal amorphous silicon film is removed and a film comprising one or more of TiN, Ti, TaN, or Ta is deposited.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, common words have been used, where possible, to designate identical elements that are common to the figures. It is contemplated that elements disclosed in some embodiments may be beneficially utilized on other embodiments without specific recitation.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Embodiments described herein generally relate to doping of three dimensional (3D) structures on a substrate. Some embodiments of the disclosure advantageously provide methods of forming a conformal dopant containing film on 3D structures. Some embodiments of the disclosure advantageously provide methods of doping halogens into conformal films. Some embodiments advantageously provide methods of forming uniform doping of halogens using a subsequent annealing process to diffuse the dopants into the 3D structures.

Some embodiments of the disclosure advantageously provide conformal halogen doped silicon to replace fluorine-doped TiSiN, TiN or TaN to dope high-k dielectrics.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Figure 1:
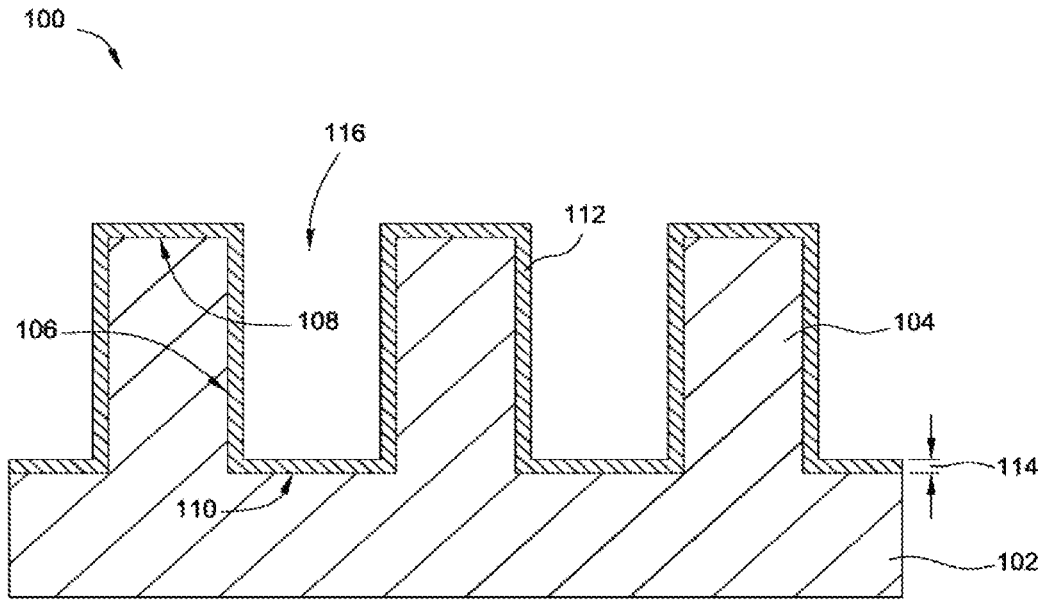
FIG. 1 illustrates a schematic, cross-sectional view of a substrate having three dimensional (3D) structures formed thereon according to some embodiments described herein.

FIG. 1 illustrates a schematic, cross-sectional view of a substrate 100 having three dimensional (3D) structures 104 formed thereon according to one or more embodiment described herein. The substrate 100 includes the 3D structures 104 which extend from a base material layer 102. In some embodiments, the base material layer 102 may be silicon containing material, such as pure silicon or doped silicon. In another embodiment the base material layer 102 may be an insulator material, such as oxides, nitrides, or the like. For example, the substrate 100 may be a silicon-on-insulator substrate. The embodiments described herein are generally made with reference to a 300 mm circular substrate, however, it is contemplated that various other substrate dimensions may benefit from the embodiments described herein.

The 3D structures 104 may be formed on the base material layer 102 by various patterning and etching processes. Generally, the 3D structures are formed with dimensions suitable for implementation as fin field-effect transistors (FinFETs) in complimentary metal-oxide semiconductor (CMOS) transistors, however, other transistor types may also benefit from the embodiments described herein. In some embodiments, the 3D structures may be suitable for and may have dimensions commensurate for utilization in current technology nodes and advanced technology nodes, such as a sub-10 nm node.

The 3D structures 104 may be the same material as the base material layer 102 (as illustrated in FIG. 1) or a material different from the base material layer 102. In some embodiments, the 3D structures 104 may be formed from silicon. In other embodiments, the 3D structures may include multiple materials, such as silicon and one or more dopants. The 3D structures 104 extend from the base material layer 102 and are spaced apart by trenches 116. The 3D structures include a top surface 108 and sidewalls 106 which extend between the top surface 108 and a bottom surface 110 of the trenches 116.

A conformal film 112 is deposited over the 3D structures 104 and the base material layer 102. The conformal film 112 generally maintains a constant or substantially constant thickness regardless of the region where the conformal film 112 is deposited. In some embodiments, the conformal film 112 may be deposited with greater than about 70% conformity, greater than about 80% conformity, greater than about 90% conformity, greater than about 95% conformity or greater than about 98% conformity. For example, a thickness 114 of the conformal film 112 may be maintained adjacent the top surface 108, the sidewalls 106, and the bottom surface 110 such that the thickness is predominantly equal across about 70% of the conformal film 112. In some embodiments, the thickness 114 may be between about 10 nm and about 100 nm, depending on the 3D structure dimensions and desired doping characteristics.

The conformal film 112 may be deposited by various deposition techniques, such as chemical vapor deposition (CVD) or atomic layer deposition (ALD) or plasma based deposition techniques. In some embodiments, the conformal film 112 may be deposited by a thermal CVD technique in which a thermal precursor vaporization apparatus may be coupled to a suitably configured film deposition chamber to prepare various precursors prior to deposition. Temperatures utilized by the thermal precursor vaporization apparatus may be between about 70° C. and about 150° C., depending on the precursor utilized. In another embodiment, the conformal film 112 may be deposited by a plasma enhanced chemical vapor deposition (PECVD) deposition technique in which the plasma may be generated by a remote plasma source or may be generated inside a processing chamber. In another embodiment, the conformal film 112 may be deposited by a hybrid thermal/plasma deposition technique.

Figure 2:
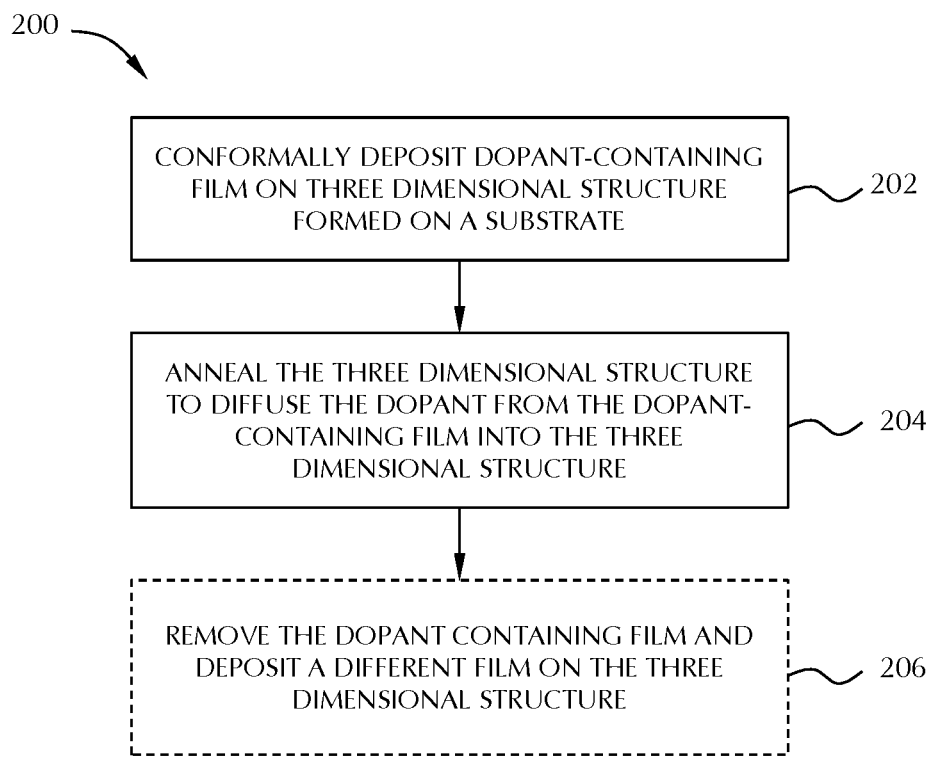
FIG. 2 illustrates operations of a method for performing a conformal film deposition and doping process according to embodiments described herein.

FIG. 2 illustrates operations of a method 200 for performing a conformal film deposition and doping process according to embodiments described herein. At operation 202, a conformal dopant containing film may be deposited on 3D structures formed on a substrate. The film may be deposited utilizing suitable processing conditions configured to provide for conformity as described above. In some embodiments, the dopant containing conformal film may be deposited on a substrate which is positioned in a processing region of a film deposition chamber. The dopant containing conformal film may include dopants and non-dopant materials in certain embodiments. Suitable dopants species include boron, phosphorous, arsenic, antimony, aluminum, and gallium, among others. Non-dopant materials include carbon, nitrogen, silicon, and oxygen, among others. Generally, the dopants in the conformal film will be diffused into the 3D structures during subsequent processing operations while the non-dopant materials will not diffuse into the 3D structures.

In some embodiments, a doped silicon film is deposited on the 3D structures. The doped silicon film can be deposited using one or more silicon and/or halogen precursors. For example, an amorphous silicon film can be deposited with fluorine atoms doped therein. In some embodiments, the precursors include silicon and halogen atoms. In some embodiments, the silicon and halogen precursors are different compounds. In some embodiments, the silicon precursor comprises halogen atoms and a halogen precursor is also used.

Suitable silicon containing precursors include, but are not limited to, silane ($SiH_4$), silanes ($Si_nH_{2n+2}$), halosilanes ($SiX_4$), cyclic polymeric halosilanes ($SiX_2)_n$ where n is greater than or equal to 3, di- and polysilanes such as $Si_nHX_{2n+1}$ and $Si_nH_2X_{2n}$, where X is a halogen selected from one or more of fluorine, chlorine, bromine and/or iodine. In some embodiments, the halogen consists essentially of fluorine. In some embodiments, the halogen consists essentially of chlorine. In some embodiments, the halogen consists essentially of bromine. In some embodiments, the halogen consists essentially of iodine. As used in this manner, the term "consists essentially of" means that the halogen content is greater than or equal to about 95%, 98% or 99% of the stated element, on an atomic basis.

Suitable halogen precursors include, but are not limited to, $NX_3$ (e.g., $NF_3$), HX (e.g., HF), halosilanes ($SiX_4$), cyclic polymeric halosilanes (e.g., ($SiX_2)_n$ where n is greater than or equal to 3), di- and polysilanes such as $Si_nHX_{2n+1}$ and $Si_nH_2X_{2n}$, fluorohydridodisilanes (e.g., fluorodisilane ($FSi_2H_5$), difluorodisilane ($F_2Si_2H_4$), trifluorodisilane ($F_3Si_2H_3$), tetrafluoridisilane ($F_4Si_2H_2$) and pentafluorodisilane ($F_5SiH$)). In some embodiments, the halogen precursor has a general formula $Si_nX_mH_{2n+2-m}$, where m is in the range of 1 to 2n+2, or in the range of 2 to 2n+2, or in the range of 3 to 2n+2. In some embodiments, X consists essentially of fluorine. In some embodiments, X consists essentially of chlorine. In some embodiments, X consists essentially of bromine. In some embodiments, X consists essentially of iodine. As used in this manner, the term "consists essentially of" means that the halogen content is greater than or equal to about 95%, 98% or 99% of the stated element, on an atomic basis.

In some embodiments, a molecular halogen is co-flowed with, or pulsed into, the halogen precursor. For example, molecular fluorine ($F_2$) can be pulsed into or co-flowed with $SiF_4$. The molecular halogen of some embodiments is the same halogen atom as the halogen precursor. In some embodiments, the molecular halogen has a different halogen atom than the halogen precursor.

To control the elemental composition of the conformal film, the flow rates of the precursors may be varied to influence the conformal film compositional profile. In some embodiments, the flow rate of the silicon precursor and/or the halogen precursor is in the range of about 1 sccm to about 5000 sccm.

In addition, various carrier gases, such as argon, nitrogen, hydrogen, and helium, among others, may be provided to the processing volume of the film deposition chamber along with the precursors. One or more carrier gases may be provided to the film deposition chamber at a rate of between about 100 sccm to about 20,000 sccm. A partial pressure of the dopant precursor relative to the carrier gas may be between about 10 Pascal to about 1000 Pascal.

A temperature of the film deposition chamber or substrate may be maintained in the range of about 100° C. to about 650° C. during the conformal film deposition process. In some embodiments, the temperature of the substrate is maintained in the range of about 150° C. to about 600° C., or in the range of about 200° C. to about 550° C., or in the range of about 250° C. to about 500° C.

A pressure of the film deposition chamber may be maintained between about 100 mTorr and about 300 Torr during the conformal film deposition process. It is believed that precursor flow rates, chamber temperatures, and chamber pressures may be configured to influence the conformity of the dopant containing film to provide a degree of conformity suitable for subsequent doping of the 3D structures.

The concentration of the dopant in the doped silicon film can vary depending on the deposition conditions. In some embodiments, a doped silicon film has a concentration of dopant atoms greater than or equal to about $10^{19}$ atoms/cm$^3$, $10^{20}$ atoms/cm$^3$, $10^{21}$ atoms/cm$^3$ or $10^{22}$ atoms/cm$^3$. As used in this specification and the appended claims, a film with a concentration of dopant atoms less than $10^{18}$ atoms/cm$^3$ may be considered to be un-doped. Depending on the depth of diffusion as a result of the annealing process, the concentration of dopant atoms may be about 0 atoms/cm$^3$ or another negligible concentration (e.g., up to $10^{18}$ atoms/cm$^3$) which does not significantly affect device functionality (i.e. threshold voltage) of the 3D structures.

At operation 204, the 3D structures may be annealed to diffuse the dopant form the dopant containing conformal film into the 3D structures, or in to a film below the conformal film. The substrate may be transferred from the film deposition chamber to an annealing chamber, such as a rapid thermal processing chamber. Rapid thermal processing may utilize various electromagnetic energy sources to anneal the substrate. For example, radiant heating, laser annealing, or combinations thereof may be utilized to drive the dopants from the conformal film into the 3D structures.

The annealing process may be performed at a temperature in the range of about 700° C. to about 1100° C., or in the range of about 850° C. to about 1050° C. The annealing process is generally configured to quickly heat the materials disposed on the substrate in a repetitive manner. Temperature cycling may be performed on the millisecond scale to second scale and it is believed that the annealing not only causes the dopant to diffuse from the conformal film in to the 3D structures, but may also volatilize non-dopant materials of the conformal film to prevent diffusion of the non-dopant materials into the 3D structures.

The annealing process can be performed in any suitable chemical environment. In some embodiments, the annealing environment comprises inert gases. In some embodiments, the annealing environment comprises one or more reactive gases. In some embodiments, the annealing environment consists of inert gases.

As a result of the conformity of the conformal dopant containing film, dopant diffusion into the 3D structures may progress in a controlled manner such that dopant distribution within the 3D structures is predominantly uniform. In other words, the dopant diffuses into the 3D structures from multiple directions (i.e. sidewalls and top surfaces) and the depth of diffusion may be controlled by the annealing process. By selectively incorporating the dopant into the 3D structures in a uniform manner, the dopant distribution in the 3D structures may provide for improved threshold voltage engineering and may also provide for improved device performance.

After the annealing process has been performed, any remaining portions of the dopant depleted conformal film may be removed from the substrate and the 3D structures. Various etching processes, such as wet etching or dry plasma etching processes, having chemistries selected to preferentially remove the conformal film may be utilized to remove the conformal film. As a result, the 3D structures may be doped with desirable dopant species and the 3D structures may be suitable for subsequent device structure fabrication processes.

At optional operation 206, the conformal film 112 is removed and optionally replaced with a different film. The removal of the conformal film 112 can be done by any suitable technique or process known to the skilled artisan. For example, a selective etch process can remove the conformal film 112 without affecting the underlying layers or structures. After removal of the conformal film 112, a different film can be formed on the structures. For example, the conformal film 112 of some embodiments is an amorphous silicon film doped with fluorine atoms. After annealing the fluorine atoms into the underlying structure, the amorphous silicon film can be removed and replaced with a film comprising titanium nitride (TiN), titanium (Ti), tantalum (Ta), tantalum nitride (TaN), or combination thereof.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "some embodiments," "certain embodiments," "one or more embodiments" or "an embodiment" means that a particular feature, structure, material, or characteristic described in connection with the embodiment is included in at least some embodiments of the invention. Thus, the appearances of the phrases such as "in one or more embodiments," "in certain embodiments," "in some embodiments" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:
1. A method comprising:
depositing a conformal amorphous silicon film doped with halogen atom by chemical vapor deposition, the chemical vapor deposition comprising exposing a substrate to a mixture of a silicon precursor and a halogen precursor; and
annealing the amorphous silicon film doped with halogen atoms to drive the halogen atoms into the substrate,
wherein the silicon precursor and the halogen precursor are different compounds, wherein the silicon precursor comprises one or more of a silane ($Si_nH_{2n+2}$), halosilanes ($SiX_4$), cyclic polymeric halosilanes ($SiX_2)_n$ where n is greater than or equal to 3, a compound with the general formula $Si_nH X_{2n+2}$, or a compound with the general formula $Si_nH_2X_{2n}$, wherein the halogen precursor comprises one or more of $NX_3$, HX, $SiX_4$, cyclic polymeric halosilanes (($SiX_2)n$ where n is greater than or equal to 3), a compound with the general formula $Si_nHX_{2n+1}$, a compound with the general formula $Si_nH_2X_{2n}$ or a compound with the general formula $Si_nX_{2n+2-m}$, where m is in the range of 1 to 2n+2, and wherein X is fluorine;

wherein the annealing process is a rapid thermal annealing process;

wherein the rapid thermal annealing process is a spike annealing process performed at a temperature of between about 700° C. and about 1100° C.; and wherein the amorphous silicon film doped with halogen atoms has a dopant concentration greater than or equal to $10^{19}$ atoms/cm$^3$.

2. The method of claim 1, wherein the substrate comprises a FinFET device.

3. The method of claim 1, wherein the mixture further comprises a molecular fluorine.

4. The method of claim 1, wherein the spike annealing process comprises a laser spike anneal.

5. The method of claim 1, further comprising removing the amorphous silicon film from the substrate after annealing.

6. The method of claim 5, further comprising depositing a film on the substrate after removing the amorphous silicon film.

7. The method of claim 1, further comprising co-flowing or pulsing molecular fluorine into the halogen precursor.

8. A substrate processing method, comprising:
depositing a conformal halogen doped amorphous silicon film on a three dimensional structure formed on a substrate, wherein the three dimensional structure is a FinFET device;
exposing the three dimensional structure to a molecular fluorine; and
annealing the conformal halogen doped silicon film to diffuse the halogen into the three dimensional structure to dope the FinFET device with halogen atoms,
wherein depositing the conformal halogen doped film comprises exposing the three dimensional structure to a silicon and halogen precursor,
wherein the silicon precursor and halogen precursor are different compounds, wherein the silicon precursor comprises one or more of a silane ($Si_nH_{2n+2}$), halosilanes ($SiX_4$), cyclic polymeric halosilanes ($SiX_2$)n where n is greater than or equal to 3, a compound with the general formula $Si_nHX_{2n+2}$, or a compound with the general formula $Si_nH_2X_{2n}$, wherein the fluorine precursor comprises one or more of $NX_3$, HX, $SiX_4$, cyclic polymeric halosilanes (($SiX_2)n$ where n is greater than or equal to 3), a compound with the general formula $Si_nHX_{2n+1}$, a compound with the general formula $Si_nH_2X_{2n}$ or a compound with the general formula $Si_nX_mH_{2n+2-m}$, where m is in the range of 1 to 2n+2, and wherein X is fluorine;

wherein the annealing process is a rapid thermal annealing process;

wherein the rapid thermal annealing process is a spike annealing process performed at a temperature of between about 700° C. and about 1100° C.; and wherein the conformal halogen doped silicon film has a dopant concentration atoms greater than or equal to $10^{19}$ atoms/cm$^3$.

9. The method of claim 8, wherein the spike annealing process comprises a laser spike anneal.

10. A substrate processing method, comprising:
forming a three dimensional structure on a substrate;
exposing the three dimensional structure to one or more silicon and halogen containing precursors to deposit a conformal amorphous silicon film doped with fluorine atoms;
annealing the conformal amorphous silicon film to diffuse the fluorine atoms from the conformal film into the three dimensional structure;
removing the conformal amorphous silicon film; and
depositing a film comprising one or more of TiN, Ti, TaN, or Ta, wherein the silicon and halogen containing precursors are different compounds, and wherein the silicon and halogen containing precursor comprises a compound with the general formula $Si_nX_{2n+2-m}$, where m is in the range of about 1 to about 2n+2;
wherein the annealing process is a rapid thermal annealing process;
wherein the rapid thermal annealing process is a spike annealing process performed at a temperature of between about 700° C. and about 1100° C.; and
wherein the amorphous silicon film doped with fluorine atoms has a dopant concentration greater than or equal to $10^{19}$ atoms/cm$^3$.

11. The method of claim 10, further comprising flowing molecular fluorine ($F_2$) with the silicon and halogen containing precursor.

* * * * *

UNITED STATES PATENT AND TRADEMARK OFFICE
CERTIFICATE OF CORRECTION

PATENT NO. : 11,462,630 B2
APPLICATION NO. : 16/640580
DATED : October 4, 2022
INVENTOR(S) : Rui Cheng et al.

It is certified that error appears in the above-identified patent and that said Letters Patent is hereby corrected as shown below:

In the Claims

•Column 9, Line 7, replace "(SiX$_2$)n" after "halosilanes (" with "(SiX$_2$)$_n$".

•Column 10, Line 3, replace "(SiX$_2$)n" after "halosilanes" and before "where" with "(SiX$_2$)$_n$".

•Column 10, Line 7, replace "(SiX$_2$)n" after "halosilanes (" with "(SiX$_2$)$_n$".

Signed and Sealed this
Thirteenth Day of December, 2022

Katherine Kelly Vidal
*Director of the United States Patent and Trademark Office*